(12) United States Patent
Chou et al.

(10) Patent No.: US 11,644,496 B2
(45) Date of Patent: May 9, 2023

(54) MOVABLE COMPACT-RANGE ANTENNA MEASUREMENT SYSTEM

(71) Applicant: NATIONAL TAIWAN UNIVERSITY, Taipei (TW)

(72) Inventors: Hsi Tseng Chou, Taipei (TW); Chih Wei Chiu, Taipei (TW)

(73) Assignee: National Taiwan University, Taipei (TW)

( * ) Notice: Subject to any disclaimer, the term of this patent is extended or adjusted under 35 U.S.C. 154(b) by 59 days.

(21) Appl. No.: 17/307,251

(22) Filed: May 4, 2021

(65) Prior Publication Data

US 2022/0252652 A1     Aug. 11, 2022

(30) Foreign Application Priority Data

Feb. 8, 2021   (TW) .................................. 110104806

(51) Int. Cl.
   *G01R 29/08*    (2006.01)
   *B25J 19/02*    (2006.01)
   *G01R 29/10*    (2006.01)

(52) U.S. Cl.
   CPC ........ *G01R 29/0878* (2013.01); *B25J 19/027* (2013.01); *G01R 29/10* (2013.01)

(58) Field of Classification Search
   CPC ..... G01R 29/0878; G01R 29/10; B25J 19/027
   See application file for complete search history.

(56) References Cited

U.S. PATENT DOCUMENTS

| 6,606,064 | B1* | 8/2003 | Lusterman | ......... | G01R 29/0878 |
| | | | | | 343/703 |
| 2006/0139031 | A1* | 6/2006 | Kalokitis | .......... | G01R 29/0878 |
| | | | | | 324/457 |
| 2009/0284426 | A1* | 11/2009 | Snow | ..................... | G01R 29/10 |
| | | | | | 343/703 |

(Continued)

FOREIGN PATENT DOCUMENTS

| TW | M316394 U | 8/2007 |
| TW | I635290 B | 9/2018 |
| TW | I676035 B | 9/2018 |

OTHER PUBLICATIONS

Office Action for counterpart Taiwanese Patent Application No. 110104806, dated Nov. 29, 2021.

*Primary Examiner* — Alvaro E Fortich
(74) *Attorney, Agent, or Firm* — Rosenberg, Klein & Lee

(57) ABSTRACT

An antenna measurement system is configured to measure a radiation field pattern of an AUT fixed on a reference surface. The antenna measurement system includes an articulated robot, a measurement component, and a processor. The articulated robot is seated on a periphery of the reference surface, with a movable end capable of scanning a short-distance area defined by the reference surface. The measurement component is arranged on the movable end of the articulated robot, and a front surface of the measurement component is a specific geometric surface, which is used to face the antenna for radiation measurement. The processor is coupled to the movable end to control the movable end to drive the measurement component to move relative to the antenna along a predefined scanning path, and keep the specific geometric surface facing the antenna during the movement along the scanning path.

14 Claims, 16 Drawing Sheets

(56) References Cited

U.S. PATENT DOCUMENTS

2010/0321192 A1* 12/2010 Brannan ................ G01R 21/00
                                                    343/703
2016/0359718 A1* 12/2016 Banerjee ............. H04B 17/309
2018/0321292 A1   11/2018 Bartko et al.
2018/0368011 A1* 12/2018 Foegelle ........... G01R 29/0878
2020/0021370 A1*  1/2020 Huynh ................ H04B 17/102

* cited by examiner

MOVABLE COMPACT-RANGE ANTENNA MEASUREMENT SYSTEM

This application claims priority of Application No. 110104806 filed in Taiwan on 8 Feb. 2021 under 35 U.S.C. § 119; the entire contents of all of which are hereby incorporated by reference.

FIELD OF THE INVENTION

The present invention relates to an antenna radiation measurement system, in particular, to an antenna radiation measurement system with a dynamically adjustable structure according to actual test requirements to resemble a compact-range antenna radiation measurement system.

BACKGROUND OF THE INVENTION

Existing antenna radiation measurement methods require a large space to accommodate the measurement systems as a measurement site to resemble an antenna far-field radiation scenario in free space. In order to achieve the antenna radiation far-field measurement distance, the condition of distance, $R=2D^2/\lambda$, must be met (D is the size of the antenna under test (AUT) (such as length or width along the largest dimension), $\lambda$=wavelength at the measurement frequency); the distance is very long in the millimeter-wave frequency band. For example, if the measurement object is 8 cm long and 8 cm wide, the length of distance in the 28 GHz measurement frequency band needs to be at least 2.4 meters to meet the far-field condition. Existing antenna measurement methods require very large space and high costs to meet the above measurement conditions.

Besides, when measuring antenna's radiations in the millimeter-wave frequency band, the AUT needs to be fed and placed on a rotating base to sweep the radiation directions. When the base rotates, the AUT will also vibrate to cause unstable positioning. For the measurement method using the probe feeding mechanism to excite the AUT, the probe is likely to be broken by vibration and cause unstable signal transmission. For the measurement method using the RF connector feeding mechanism, vibration will produce noises and cause considerable measurement errors.

BRIEF SUMMARY OF THE DISCLOSURE

An objective of the present invention is to provide a movable compact-range antenna measurement system, which is suitable for the antenna measurement system to measure the AUT's far-field radiation patterns by short-distance measurements and also avoids the movement of the AUT, so as to solve the above-mentioned problems.

To this end, the present invention provides an antenna measurement system to measure a radiation field pattern of an AUT. The antenna measurement system includes an articulated robot, a measurement component, and a processor. The articulated robot is seated on a periphery of the reference surface mounted with the AUT, with a movable end capable of scanning a short-distance area defined by the reference surface; the measurement component is arranged on a movable end of the articulated robot, the measurement component including a specific geometric surface and a feed antenna of probe. The specific geometric surface being configured to receive a signal from the feed antenna and provide an incident signal to the AUT accordingly, or receive a signal transmitted by the AUT and provides the incident signal to the feed antenna accordingly for reception. The processor is coupled to the movable end to: control the movable end such that the movable end drives the measurement component to move relative to the AUT along a pre-defined scanning path; and keep the specific geometric surface facing the AUT during the movement along the scanning path.

According to an embodiment of the present invention, the specific geometric surface is a dish-shaped reflection surface for reflecting the signal from the feed antenna as the incident signal, and wherein the feed antenna is located between the dish-shaped reflection surface and the AUT when the processor controls the measurement component to move along the scanning path relative to the AUT.

According to an embodiment of the present invention, the specific geometric surface is a lens element for focusing the signal from the feed antenna as the incident signal, and wherein the lens element is located between the AUT and the feed antenna when the processor controls the measurement component to move along the scanning path relative to the AUT.

According to an embodiment of the present invention, the specific geometric surface is a reflection matrix with M×N reflection units for reflecting the signal from the feed antenna as the incident signal, and wherein the feed antenna is located between the reflection matrix and the AUT when the processor controls the measurement component to move along the scanning path relative to the AUT, wherein M and N are positive integers.

According to an embodiment of the present invention, the specific geometric surface is a transmission matrix with M×N transmission units for focusing the signal from the feed antenna as the incident signal, and wherein the transmission matrix is located between the AUT and the feed antenna when the processor controls the measurement component to move along the scanning path relative to the AUT, wherein M and N are positive integers.

According to an embodiment of the present invention, during the measurement, the AUT remains stationary, and the processor controls the specific geometric surface to perform a plurality of arc-shaped scans corresponding to different longitudes toward the AUT, and wherein any one of the plurality of arc-shaped scans starts from a bottom end of a normal line perpendicular to the reference surface and ends after circling the AUT to the reference surface for a circle to the bottom end of the normal line.

According to an embodiment of the present invention, during the measurement, the AUT rotates with a normal line of the reference surface as an axis, and the processor controls the specific geometric surface to perform an arc scan at a specific longitude position toward the AUT, and wherein the arc scan starts at a top end of the normal line and ends after circling the AUT to the bottom end of the normal line.

According to an embodiment of the present invention, during the measurement, the AUT remains stationary, and a radiation surface of the AUT faces the specific geometric surface; the processor controls the specific geometric surface and the radiation surface to maintain a predetermined distance to perform a two-dimensional planar scan with vertical movement and horizontal movement alternately.

According to an embodiment of the present invention, the two-dimensional planar scan comprises cyclic operation sequences of high-to-low movement, side-to-side movement, low-to-high movement, and side-to-side movement.

According to an embodiment of the present invention, the articulated robot further includes: a base, seated on a side of the reference surface of the AUT; a first robotic arm, pivotally connected to the base; a second robotic arm, pivotally connected to the first robotic arm; and a third robotic arm, pivotally connected to the second robotic arm and the movable end, wherein the third robotic arm rotates with a length direction of the second robotic arm as an axis; wherein the movable end is connected to a back surface of the measurement component.

According to an embodiment of the present invention, the scanning path is a movement track of the specific geometric surface and the AUT, wherein a predetermined distance is maintained between the specific geometric surface and the AUT when the specific geometric surface moves along the movement track.

According to an embodiment of the present invention, the AUT is parallel to the reference surface, during the measurement, the AUT rotates with a normal line of the reference surface as the axis, and the processor controls the specific geometric surface to perform a linear scan along a gravity direction toward the AUT.

According to an embodiment of the present invention, the processor is built in the articulated robot or externally connected to the articulated robot.

According to an embodiment of the present invention, the scanning path is input to the processor in advance, or is generated by the articulated robot through performing real-time calculations.

In summary, compared to traditional practices, the movable compact-range antenna measurement system adopts a novel specific geometric surface design, which may realize short-distance measurement and maintain the required measurement accuracy and reliability, so that the antenna measurement cost may be greatly reduced. This is because the specific geometric surface only needs a short distance to achieve the effect of long-distance measurement; therefore, if the manufacturer adopts the present invention, the cost of establishing a large measuring site may be saved. Further, the present invention is particularly suitable for the measurement of frequency bands of millimeter waves, and meets the requirements of production lines. On the other hand, when the AUT is completely stationary (or only rotating in place), the present invention uses the articulated robot to perform adaptive multi-point measurement to obtain multi-angle data of the AUT; therefore, the above results may be realized by only one measurement on a single site, and there is no need to establish multiple measurement sites. Moreover, the articulated robot may include three antenna measurement architectures: planar, cylindrical, and spherical, which may be adjusted to meet different measurement requirements, so that there is no need to build different system for each measurement architecture, which may better meet the requirements of production line applications.

DESCRIPTIONS OF DRAWINGS

Figure 1:
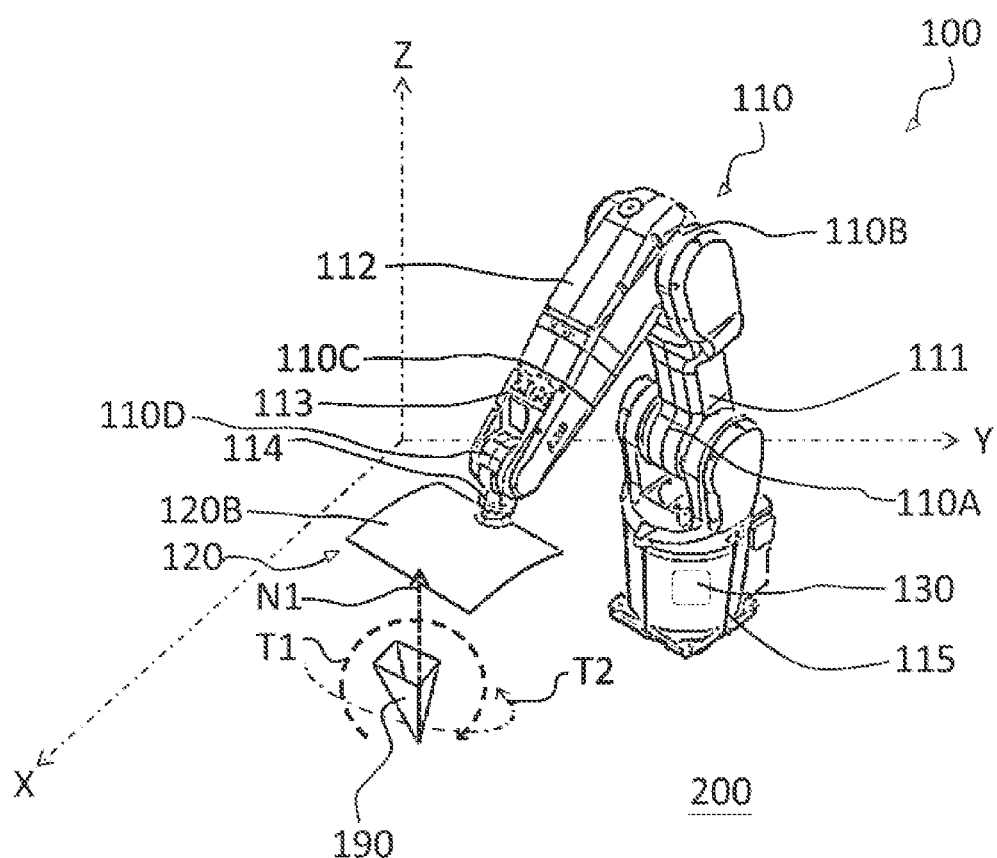
FIG. 1 is a view of measuring an AUT with an antenna measurement system according to an embodiment of the present invention.

DESCRIPTIONS OF REFERENCE NUMERALS 100, 500, 900, 1300—antenna measurement system; 110—articulated robot; 110A, 110B, 110C, 100D—pivotally connecting point; 111—first robotic arm; 112—second robotic arm; 113—third robotic arm; 114—movable end; 115—base; 190, 290, 390, 490—AUT; 120, 520, 920, 1320—measurement component; 120A, 920A—reflection surface; 120B, 520B, 920B, 1320B—back surface; 125, 525, 925, 1325—feed antenna; 126, 526, 926, 1326—connecting portion; 130—processor; 200—reference surface; 300—radiation surface; 520A, 1320A—transmission surface; 524—lens element; 924—reflection matrix; 1324—transmission matrix; N1—normal line; T1 to T7—track.

DETAILED DESCRIPTION OF THE INVENTION

The disclosure is described in particular with the following examples, which are only for illustrative purposes, because for those who are familiar with the art, various changes and modifications can be made without departing from the spirit and scope of the disclosure. Therefore, the protection scope of this disclosure shall be subject to those defined by the attached patent application scope. Throughout the specification and the scope of the patent application, unless the content is clearly specified, the meaning of "a" and "the" includes this type of description including "one or at least one" of the element or component. In addition, as used in this disclosure, unless it is obvious from a specific context that the plural number is excluded, the singular article also includes the description of the plural elements or components. Moreover, when applied to this description and the scope of all the following patent applications, unless the content is clearly specified, the meaning of "in it" may include "in it" and "on it." The terms used throughout the specification and the scope of the patent application, unless otherwise specified, usually have the usual meaning of each term used in this field, in the content disclosed here, and in the special content. Some terms used to describe this disclosure will be discussed below or elsewhere in this specification to provide practitioners with additional guidance on the description of this disclosure. The examples anywhere in the entire specification, including the use of examples of any terms discussed herein, are for illustration only, and certainly do not limit the scope and meaning of the disclosure or any exemplified terms. Likewise, the present disclosure is not limited to the various embodiments proposed in this specification.

The terms "substantially", "around", "about" or "approximately" used here should generally mean within 20% of a given value or range. It is preferably within 10%. In addition, the numbers provided here can be approximate, which means that unless otherwise stated, they can be expressed by the words "about", "about" or "nearly". When a quantity, concentration, or other value or parameter has a specified range, a preferred range, or a table with upper and lower ideal values, it shall be regarded as a special disclosure of all ranges constituted by any pairs of upper and lower limits or ideal values, regardless of whether these ranges are disclosed separately. For example, if a certain length of the disclosure range is X cm to Y cm, it should be regarded as the disclosure length is H cm and H can be any real number between X and Y.

In addition, if the term "electrically coupled" or "electrical connected" is used, this includes any direct and indirect electrical connection means. For example, if it is described that a first device is electrically coupled to a second device, it means that the first device can be directly connected to the second device, or indirectly connected to the second device through other devices or connecting means. In addition, if the description is about the transmission and provision of electrical signals, those who are familiar with this skill should be able to understand that the transmission of electrical signals may be accompanied by attenuation or other non-ideal changes; however, if the source and receiving end of the transmission or provision of electrical signals are not specifically stated, they should essentially be regarded as the same signal. For example, if the terminal A of the electronic circuit transmits (or provides) an electrical signal S to the terminal B of the electronic circuit, a voltage drop may be generated through the source and drain terminals of a transistor switch and/or possible stray capacitance. However, if the purpose of this design does not deliberately use the attenuation or other non-ideal changes produced during transmission (or provision) to achieve certain specific technical effects, the electrical signal S should be regarded as substantially the same signal at the terminal A and the terminal B of the electronic circuit.

It is to be understood that the terms "comprising", "including", "having", "containing", "involving", etc. used herein are open-ended, which means including but not limited to. In addition, any embodiment of the present invention or the scope of the patent application does not have to achieve all the objectives or advantages or features disclosed in the present invention. In addition, Abstract and Title are only used to assist in searching for patent documents, not to limit the scope of the patent application of the present invention.

With reference to FIG. 1, FIG. 1 is a view of measuring an AUT 190 with an antenna measurement system 100 according to an embodiment of the present invention, wherein the AUT 190 is fixed on a reference surface 200 (e.g., X-Y plane in FIG. 1). The antenna measurement system 100 includes an articulated robot 110, a measurement component 120 and a processor 130. The articulated robot 110 is seated on a periphery of the reference surface 200, and includes a first robotic arm 111, a second robotic arm 112, a third robotic arm 113, a movable end 114 and a base 115 seated on the periphery of the reference surface 200. The first robotic arm 111 is pivotally connected to the base 115 (e.g., as shown by a pivotally connecting point 110A); the second robotic arm 112 is pivotally connected to the first robotic arm 111 (e.g., as shown by a pivotally connecting point 110B); the third robotic arm 113 is pivotally connected to the second robotic arm 112 and to the movable end 114 (e.g., as shown by a pivotally connecting point 110C and a pivotally connecting point 110D respectively), and rotates with a length direction of the second robotic arm 112 as an axis. Although the processor 130 in the embodiment of FIG. 1 may be built in the articulated robot 110, such as the base 115 or other components, the processor 130 may also be designed to be externally connected to the articulated robot 110 in some examples of the present invention.

Figure 2:
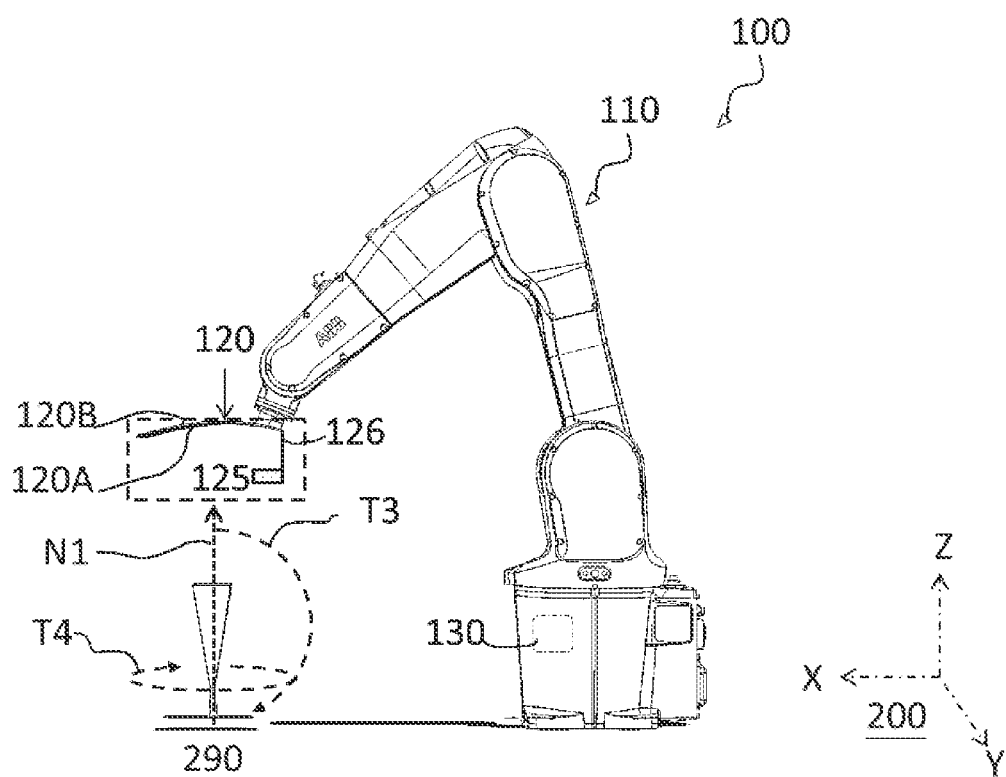
FIG. 2 is a view of measuring an AUT with an antenna measurement system according to another embodiment of the present invention.

The measurement component 120 is arranged at the movable end 114 of the articulated robot 110 and includes a dish-shaped reflection surface (not shown in FIG. 1, with a front surface with reference to an element 120A in FIG. 2 and a back surface with reference to an element 120B in FIG. 1) and a feed antenna (as shown by an element 125 in FIG. 2). The movable end 114 is connected to the back surface 120B of the measurement component 120, and the movable end may scan a short-distance area defined by the reference surface. The reflection surface 120A of the measurement component 120 presents a concave shape such as a disc, and is used to face the AUT 190 for measurement, wherein the disc-shaped reflection surface 120A is configured to reflect a signal from the feed antenna 125 as an incident signal of the AUT 190. In the present embodiment, the signal of the feed antenna 125 is, for example, a spherical wave or a cylindrical wave, which, after being reflected by the disc-shaped reflection surface 120A, is converted into a plane wave and sent to the AUT 190. The processor 130 is coupled to the first robotic arm 111, the second robotic arm 112, the third robotic arm 113 and the movable end 114 for controlling the movable end 114 to drive the measurement component 120 to move relative to the AUT 190 along a scanning path, wherein the scanning path may be a movement track of the measuring component 120 and the AUT 190 kept within a predetermined distance (e.g., as shown by a track T1). When the processor 130 controls the measurement component 120 to move along the scanning path, it will keep the reflection surface 120A of the measurement component 120 facing the AUT 190, wherein when the processor 130 controls the measurement component 120 to move along the scanning path relative to the AUT 190, the feed antenna 190 is located between the reflection surface 120A and the AUT 190. Further, when the antenna measurement system 100 performs a measurement, the AUT 190 will remain stationary, and the processor 130 controls the measurement component 120 to scan the AUT 190 along an arc of the AUT 190 at a specific longitude, wherein the arc scan of each longitude starts at the reference surface 200

(i.e., a bottom of a normal line N1) and ends after circling the AUT 190 (e.g., as shown by the track T1, but according to the actual shape of the measurement component 120, the circling angle should be slightly less than 360 degrees); however, after the arc scan in this longitude is completed, the reflection surface 120A of the measurement component 120 keeps facing the AUT 190, moves along the track T2 to the next longitude to continue the arc scan, and finally completes an entire spherical scan. In other words, the overall scanning path used for measurement takes the AUT 190 as the center of the sphere, and moves−180 degrees to +180 degrees along the longitude line of the virtual sphere, as well as performing a circular scan starting in the X-Y plane and ending in the X-Y plane at different longitudes, wherein two consecutive scans in different longitudes may differ by 1 degree in longitude, which is not limited by the present invention. Moreover, the scanning path of the measurement component 120 may be input to the processor 130 by the user in advance, wherein the user may define the sampling interval or the moving speed for measuring of the articulated robot. In addition, the AUT 190 may be additionally coupled to a network analyzer for further analysis of the data.

With reference to FIG. 2, FIG. 2 is a view of measuring an AUT 290 with an antenna measurement system 100 according to another embodiment of the present invention. As shown in FIG. 2, the measurement component 120 includes a feed antenna 125 and a connecting portion 126 for connecting the feed antenna 125 with the measurement component 120. The present invention does not limit the material of the connecting portion 126. The connecting portion 126 is arranged to allow the feed antenna 125 to be separated from the reflection surface 120A by a predetermined distance as the focal length. How to set the predetermined distance is not the main discussion part of the present invention, so it will not be described in detail.

In the present embodiment, when the antenna measurement system 100 performs measurement, the AUT 290 rotates with the normal line N1 of the reference surface 200 as the axis (as shown by a track T4); in this way, the processor 130 does not need to perform arc scan in multiple longitudes. As shown in FIG. 2, the processor 130 controls the reflection surface 120A to perform arc scan toward the AUT 290 without displacement in the longitude direction (as shown by a track T3), wherein the arc scan starts at the normal line N1 and ends after circling the AUT 290 for 180 degrees. For example, after the measurement component 120 performs a certain longitudinal scan of the AUT 290 along the track T3, the AUT 290 will rotate horizontally in the direction (parallel to the reference surface 200), so that it perform scan in the next longitude toward the reflection surface 120A, and then the measurement component 120 repeats the scan of the track T3, and so on, until an entire spherical scan is completed, wherein two consecutive scans in different longitudes may differ by 1 degree in longitude, which is not limited by the present invention.

Compared with the embodiment of FIG. 1, a motion path of the articulated robot 110 in FIG. 2 is relatively simple, but the AUT 290 needs to be built-in or mounted on a rotating device, such as a turntable (not shown). For example, the rotating device may be coupled to the processor 130 for receiving a control signal from the processor 130, so that the rotating device drives the AUT 290 to rotate around the normal line N1 as the axis. Through the rotation of the AUT 290, the articulated robot 110 only needs to circle the virtual sphere along the AUT 290 for half a circle, e.g., moving 180 degrees downwards from the circular longitude line 0 degrees around the AUT 290 with a center point of the AUT 290 as a center of circle (e.g., as shown by the track T3, but according to the actual shape of the measurement component 120, the circling angle should be slightly less than 180 degrees) while the AUT 290 maintaining a−180 to 180 rotation in the horizontal direction (e.g., as shown by the track T4, parallel to the reference surface 200). In addition, the AUT 290 may be additionally coupled to a network analyzer for further analysis of the data.

Figure 3:
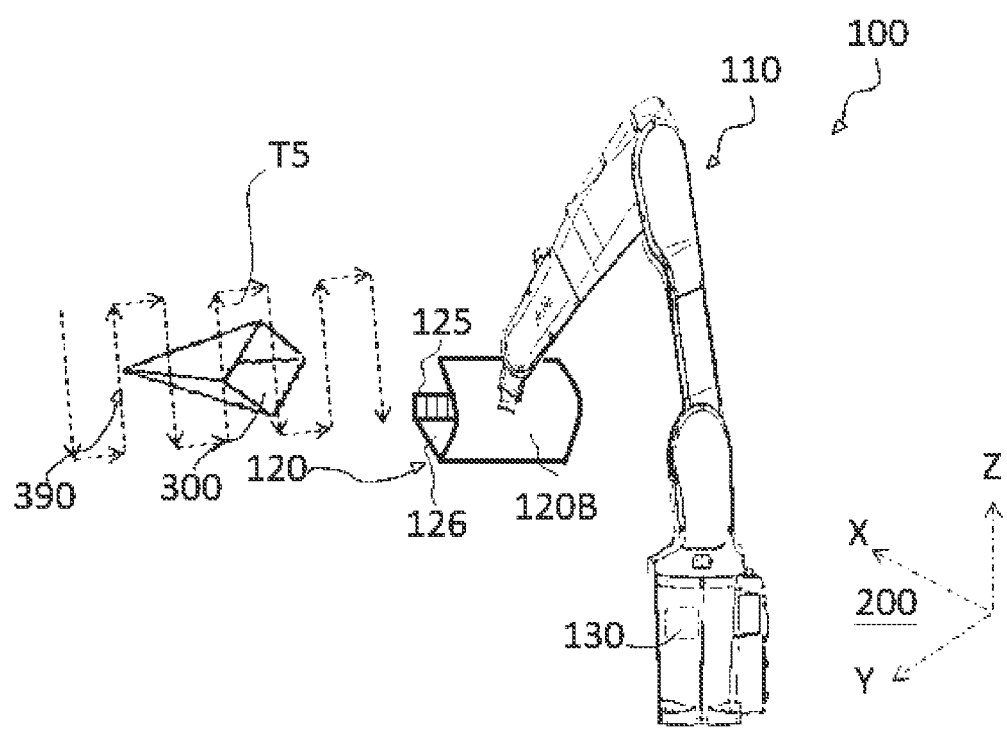
FIG. 3 is a view of measuring an AUT with an antenna measurement system according to another embodiment of the present invention.

With reference to FIG. 3, FIG. 3 is a view of measuring an AUT 390 with an antenna measurement system 100 according to another embodiment of the present invention. In the present embodiment, when the antenna measurement system 100 performs measurement, the AUT 390 is substantially parallel to the reference surface 200, and a radiation surface 300 of the AUT 390 (may be a virtual plane, i.e., the Y-Z plane) is substantially facing the reflection surface 120A (only the back surface 120B of the measurement component 120 appears in the viewing angle of FIG. 3). During the measurement, the AUT 390 remains stationary, the processor 130 controls the measurement component 120 and the radiation surface 300 to maintain a predetermined distance to perform a two-dimensional planar scan with vertical movement and horizontal movement alternately (e.g., as shown by a track T5), wherein the two-dimensional planar scan may be cyclic operation sequences of high-to-low movement, side-to-side movement, low-to-high movement, and side-to-side movement. For example, when the articulated robot is facing the AUT 390 in the X-axis direction, the scanning path will move in an S-like manner on the Y-Z plane until the entire planar scan of the AUT 390 is completed. In addition, the AUT 390 may be additionally coupled to a network analyzer for further analysis of the data.

Figure 4:
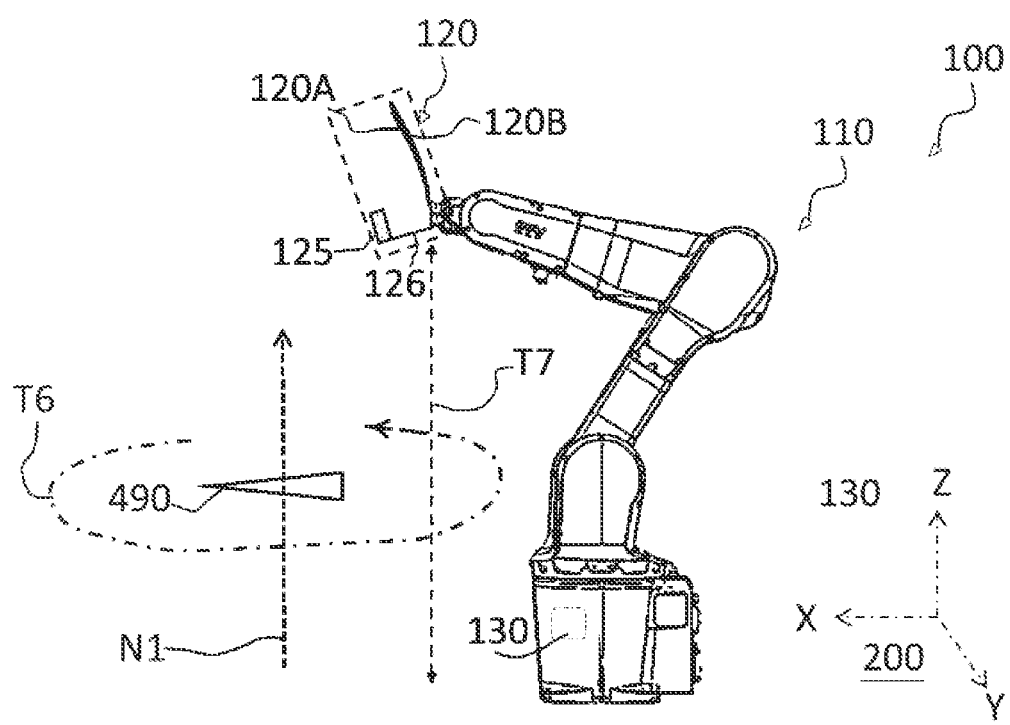
FIG. 4 is a view of measuring an AUT with an antenna measurement system according to another embodiment of the present invention.

With reference to FIG. 4, FIG. 4 is a view of measuring an AUT 490 with an antenna measurement system 100 according to another embodiment of the present invention. In the present embodiment, when the antenna measurement system 100 performs measurement, the AUT 490 is substantially parallel to the reference surface 200. During the measurement, the AUT 490 rotates with the normal line N1 as the axis (as shown by a track T6), the processor 130 controls the reflection surface 120A to perform a linear scan in the direction of gravity (i.e., the Z-axis direction) of the AUT 490 (as shown by a track T7), the scanning path keeps moving up and down vertically, and the AUT 490 rotates from −180 degrees to +180 horizontally (parallel to the reference surface 200). In detail, the measurement method is that the articulated robot 110 moves vertically from the highest point to the lowest point, or from the lowest point to the highest point; during the movement, the track T7 will remain parallel to the normal line N1. After the articulated robot 110 completes the vertical scan of the current longitude position, the AUT rotates to the next longitude position, and the articulated robot 110 performs vertical scan again, and so on, until an entire cylindrical measurement program is completed, wherein two consecutive scans in different longitudes may differ by 1 degree in longitude, which is not limited by the present invention. Similar to the AUT 290 in FIG. 2, the AUT 490 in FIG. 4 may be built-in or mounted with a rotating device (not shown) to achieve a rotating effect. For example, the rotating device may be coupled to the processor 130 for receiving a control signal from the processor 130, so that the rotating device drives the AUT 490 to rotate around the normal line N1 as the axis. In addition, the AUT 490 may be additionally coupled to a network analyzer for further analysis of the data.

The above embodiments in FIGS. 1 to 4 are all embodiments based on a disc-shaped reflection surface, and in the following, the embodiment of FIGS. 5 to 8 replaces the disc-shaped reflection surface with a lens.

Figure 5:
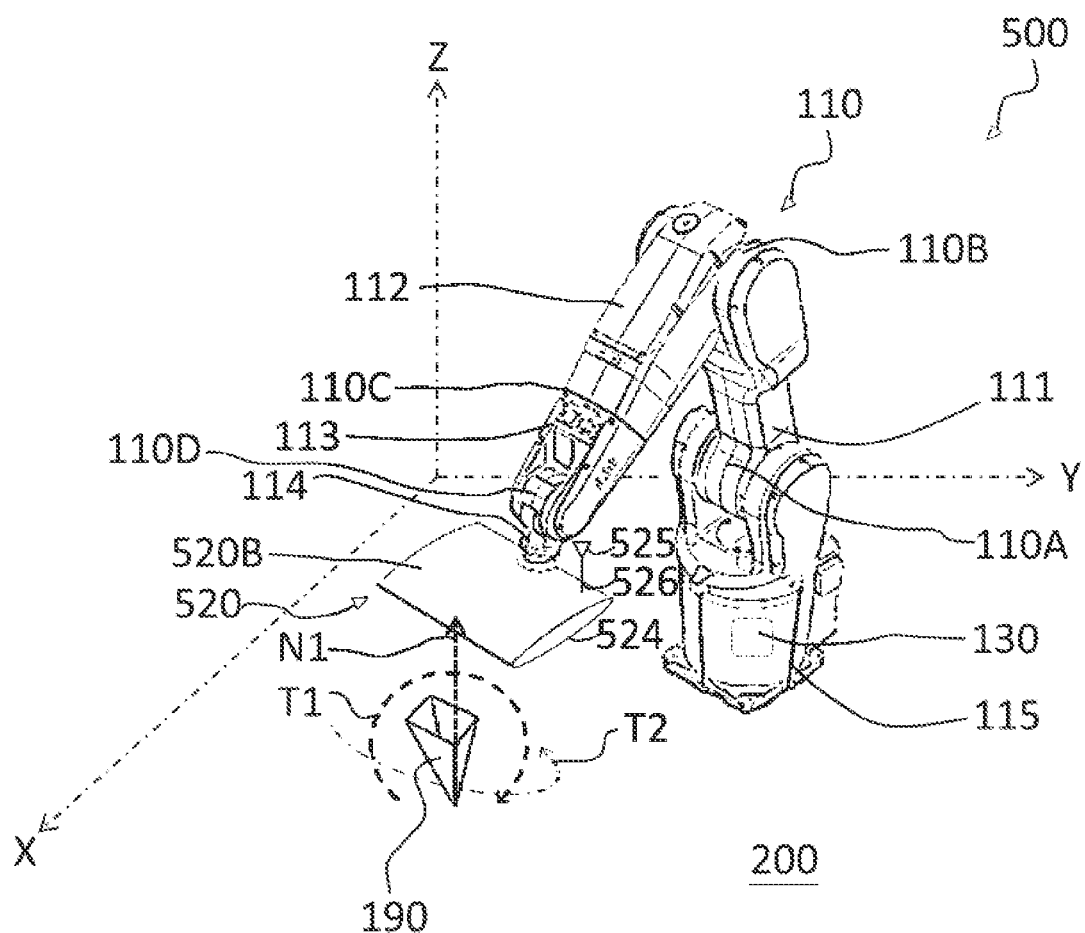
FIG. 5 is a view of measuring an AUT with an antenna measurement system according to another embodiment of the present invention.
Figure 6:
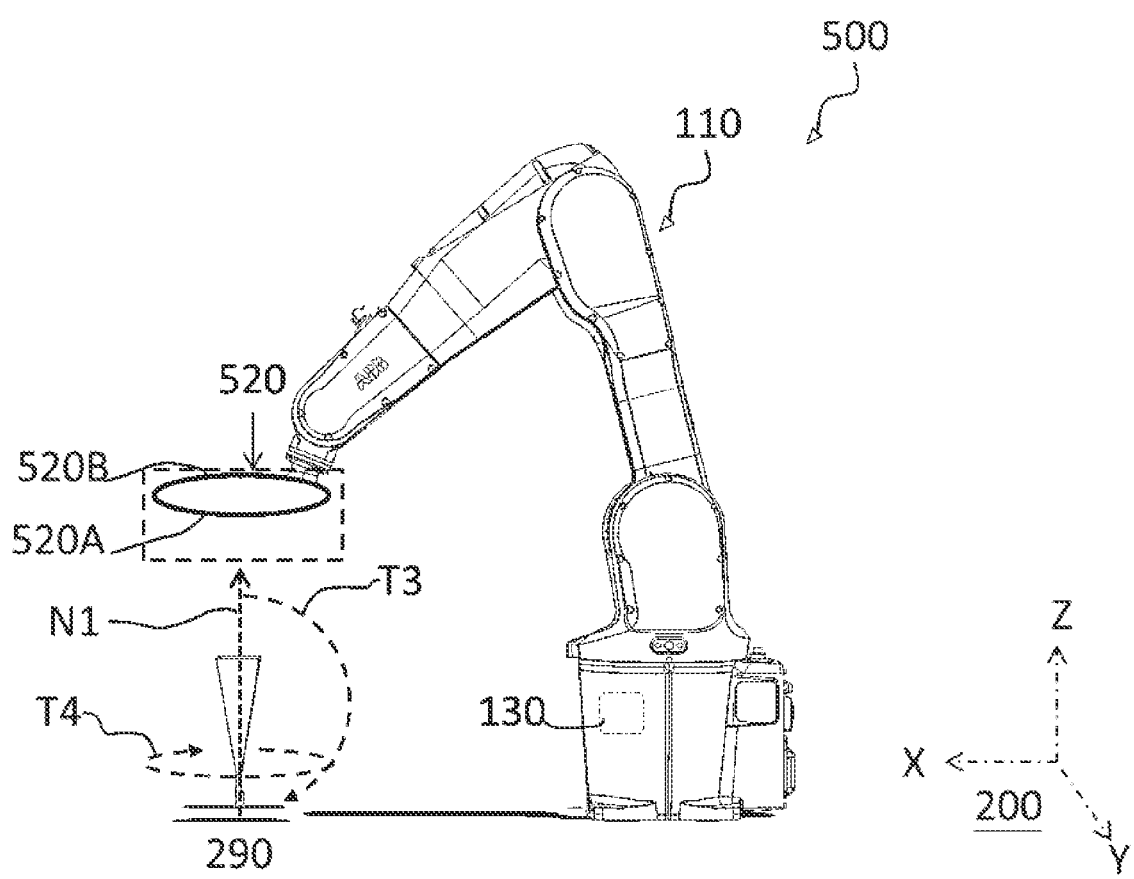
FIG. 6 is a view of measuring an AUT with an antenna measurement system according to another embodiment of the present invention.

With reference to FIG. 5, FIG. 5 is a view of measuring an AUT 190 with an antenna measurement system 500 according to an embodiment of the present invention; the antenna measurement system 500 differs from the antenna measurement system 100 in that the antenna measurement system 500 replaces the disc-shaped reflection surface with a lens. As shown in FIG. 5, the measurement component 520 includes a lens element 524, a feed antenna 525, and a connecting portion 526 for connecting the feed antenna 525 with the measurement component 520, wherein the feed antenna 525 is located on a back surface 520B of the measurement component 520, the feed antenna 525 is configured to provide the incident signal to the AUT 190, and the lens element 524 is configured to focus the signal from the AUT 190. The present invention does not limit the material of the connecting portion 526. The connecting portion 526 is arranged to allow the feed antenna 525 to be separated from a transmission surface 520A (as shown in FIG. 6) by a predetermined distance as the focal length. How to set the predetermined distance is not the main discussion part of the present invention, so it will not be described in detail. Compared with the feed antenna 125 in FIG. 1, the incident signal of the feed antenna 525 is directly received by the AUT 190, and no additional reflection mechanism (such as the reflection surface 120A in FIG. 1) is used; therefore, the feed antenna 525 must be placed on the back surface 520B of the lens element 520, i.e., the lens element 524 is located between the AUT 190 and the feed antenna 525 when the processor 130 controls the measurement component 520 to move along the scanning path relative to the AUT 190. In the present embodiment, the signal of the feed antenna 525 is also a spherical wave or a cylindrical wave, which, after being refracted by the lens element 524, is converted into a plane wave and sent to the AUT 190.

When the antenna measurement system 500 performs a measurement, the AUT 190 will remain stationary, and the processor 130 controls the measurement component 520 to scan the AUT 190 along an arc of the AUT 190 at a specific longitude, wherein the arc scan of each longitude starts at the reference surface 200 (i.e., a bottom of a normal line N1) and ends after circling the AUT 190 (e.g., as shown by the track T1, but according to the actual shape of the measurement component 520, the circling angle should be slightly less than 360 degrees); however, after the arc scan in this longitude is completed, the transmission surface 520A keeps facing the AUT 190, moves along the track T2 to the next longitude to continue the arc scan, and finally completes an entire spherical scan. In other words, the overall scanning path used for measurement takes the AUT 190 as the center of the sphere, and moves –180 degrees to +180 degrees along the longitude line of the virtual sphere, as well as performing a circular scan starting in the X-Y plane and ending in the X-Y plane at different longitudes, wherein two consecutive scans in different longitudes may differ by 1 degree in longitude, which is not limited by the present invention. Moreover, the scanning path of the measurement component 520 may be input to the processor 130 by the user in advance, wherein the user may define the sampling interval or the articulated robot to measure the moving speed.

With reference to FIG. 6, FIG. 6 is a view of measuring an AUT 290 with an antenna measurement system 500 according to another embodiment of the present invention. In the present embodiment, when the antenna measurement system 500 performs measurement, the AUT 290 rotates with the normal line N1 of the reference surface 200 as the axis (as shown by a track T4); in this way, the processor 130 does not need to perform arc scan in multiple longitudes. As shown in FIG. 6, the processor 130 controls the transmission surface 520A to perform arc scan toward the AUT 290 without displacement in the longitude direction (as shown by a track T3), wherein the arc scan starts at the normal line N1 and ends after circling the AUT 290 for 180 degrees. For example, after the measurement component 520 performs a certain longitudinal scan of the AUT 290 along the track T3, the AUT 290 will rotate horizontally in the direction (parallel to the reference surface 200), so that it perform scan in the next longitude toward the transmission surface 520A, and then the measurement component 250A repeats the scan of the track T3, and so on, until an entire spherical scan is completed, wherein two consecutive scans in different longitudes may differ by 1 degree in longitude, which is not limited by the present invention.

Compared with the embodiment of FIG. 5, a motion path of the articulated robot 110 in FIG. 6 is relatively simple, but the AUT 290 needs to be built-in or mounted on a rotating device, such as a turntable (not shown). For example, the rotating device may be coupled to the processor 130 for receiving a control signal from the processor 130, so that the rotating device drives the AUT 290 to rotate around the normal line N1 as the axis. Through the rotation of the AUT 290, the articulated robot 110 only needs to circle the virtual sphere along the AUT 290 for half a circle, e.g., moving 180 degrees downwards from the circular longitude line 0 degrees around the AUT 290 with a center point of the AUT 290 as a center of circle (e.g., as shown by the track T3, but according to the actual shape of the measurement component 520, the circling angle should be slightly less than 180 degrees) while the AUT 290 maintaining a –180 to 180 rotation in the horizontal direction (e.g., as shown by the track T4, parallel to the reference surface 200). It should be noted that for the sake of brevity, the feed antenna 525 is omitted in this figure.

Figure 7:
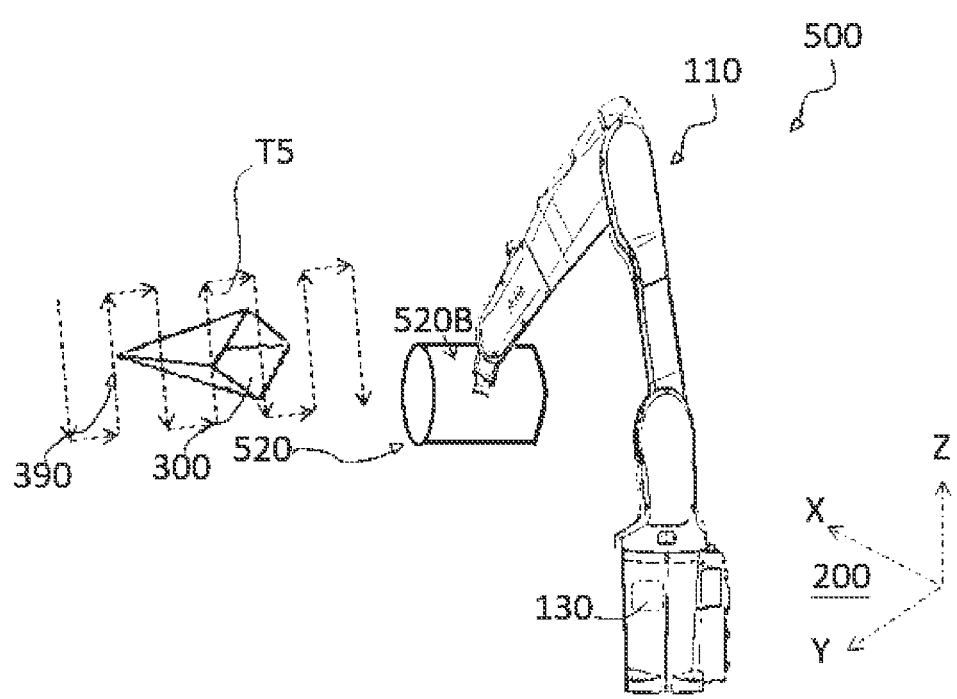
FIG. 7 is a view of measuring an AUT with an antenna measurement system according to another embodiment of the present invention.

With reference to FIG. 7, FIG. 7 is a view of measuring an AUT 390 with an antenna measurement system 500 according to another embodiment of the present invention. In the present embodiment, when the antenna measurement system 500 performs measurement, the AUT 390 is substantially parallel to the reference surface 200, and a radiation surface 300 of the AUT 390 (may be a virtual plane, i.e., the Y-Z plane) is substantially facing the transmission surface 520A (only the back surface 520B of the measurement component 520 appears in the viewing angle of FIG. 7). During the measurement, the AUT 390 remains stationary, the processor 130 controls the measurement component 520 and the radiation surface 300 to maintain a predetermined distance to perform a two-dimensional planar scan with vertical movement and horizontal movement alternately (e.g., as shown by a track T5), wherein the two-dimensional planar scan may be cyclic operation sequences of high-to-low movement, side-to-side movement, low-to-high movement, and side-to-side movement. For example, when the articulated robot is facing the AUT 390 in the X-axis direction, the scanning path will move in an S-like manner on the Y-Z plane until the entire planar scan of the AUT 390 is completed. It should be noted that for the sake of brevity, the feed antenna 525 is omitted in this figure.

Figure 8:
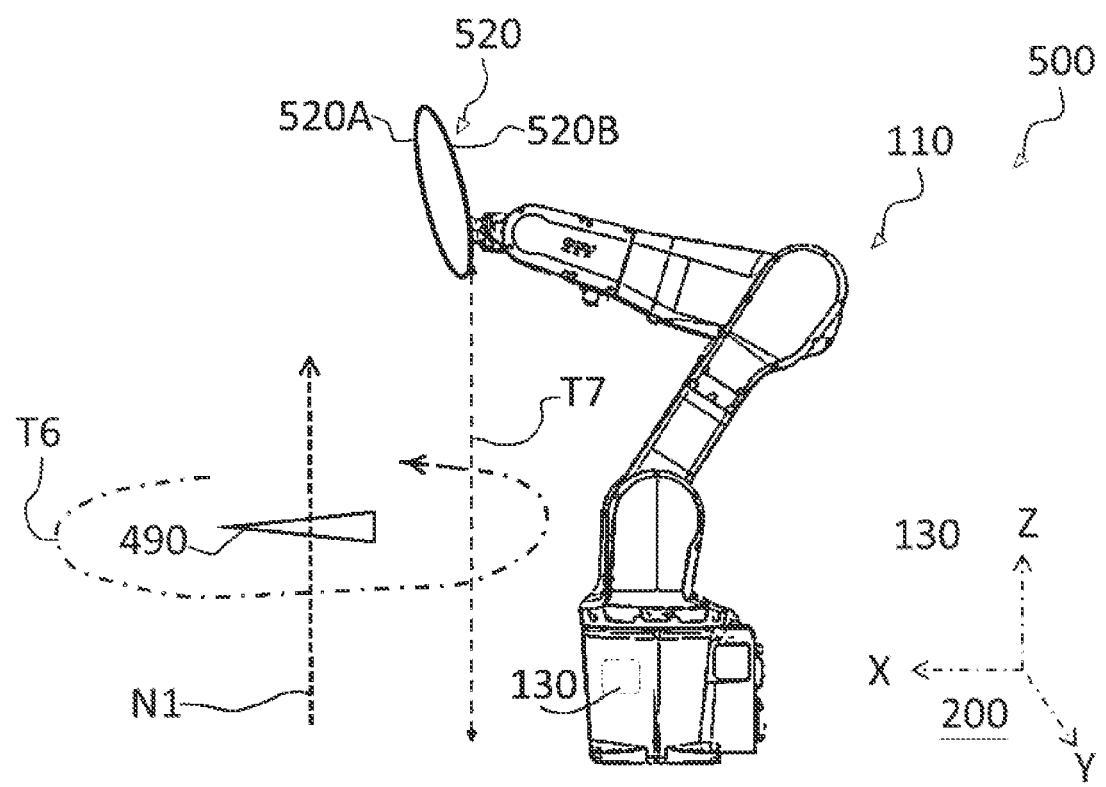
FIG. 8 is a view of measuring an AUT with an antenna measurement system according to another embodiment of the present invention.

With reference to FIG. 8, FIG. 8 is a view of measuring an AUT 490 with an antenna measurement system 500 according to another embodiment of the present invention. In the present embodiment, when the antenna measurement system 500 performs measurement, the AUT 490 is substantially parallel to the reference surface 200. During the measurement, the AUT 490 rotates with the normal line N1 as the axis (as shown by a track T6), the processor 130 controls the measurement component 520 to perform a linear scan in the direction of gravity (i.e., the Z-axis direction) for the AUT 490 (as shown by a track T7), the scanning path keeps moving up and down vertically, and the AUT 490 rotates from −180 degrees to +180 horizontally (parallel to the reference surface 200). In detail, the measurement method is that the articulated robot 110 moves vertically from the highest point to the lowest point, or from the lowest point to the highest point; during the movement, the track T7 will remain parallel to the normal line N1. After the articulated robot 110 completes the vertical scan of the current longitude position, the AUT 490 rotates to the next longitude position, and the articulated robot 110 performs vertical scan again, and so on, until an entire cylindrical measurement program is completed, wherein two consecutive scans in different longitudes may differ by 1 degree in longitude, which is not limited by the present invention. Similar to the AUT 290 in FIG. 6, the AUT 490 in FIG. 8 may be built-in or mounted with a rotating device (not shown) to achieve a rotating effect. For example, the rotating device may be coupled to the processor 130 for receiving a control signal from the processor 130, so that the rotating device drives the AUT 490 to rotate around the normal line N1 as the axis. It should be noted that for the sake of brevity, the feed antenna 525 is omitted in this figure. Similarly, the AUTs 190 to 490 of FIGS. 5 to 8 may be additionally coupled to a network analyzer for further analysis of the data.

Figure 9:
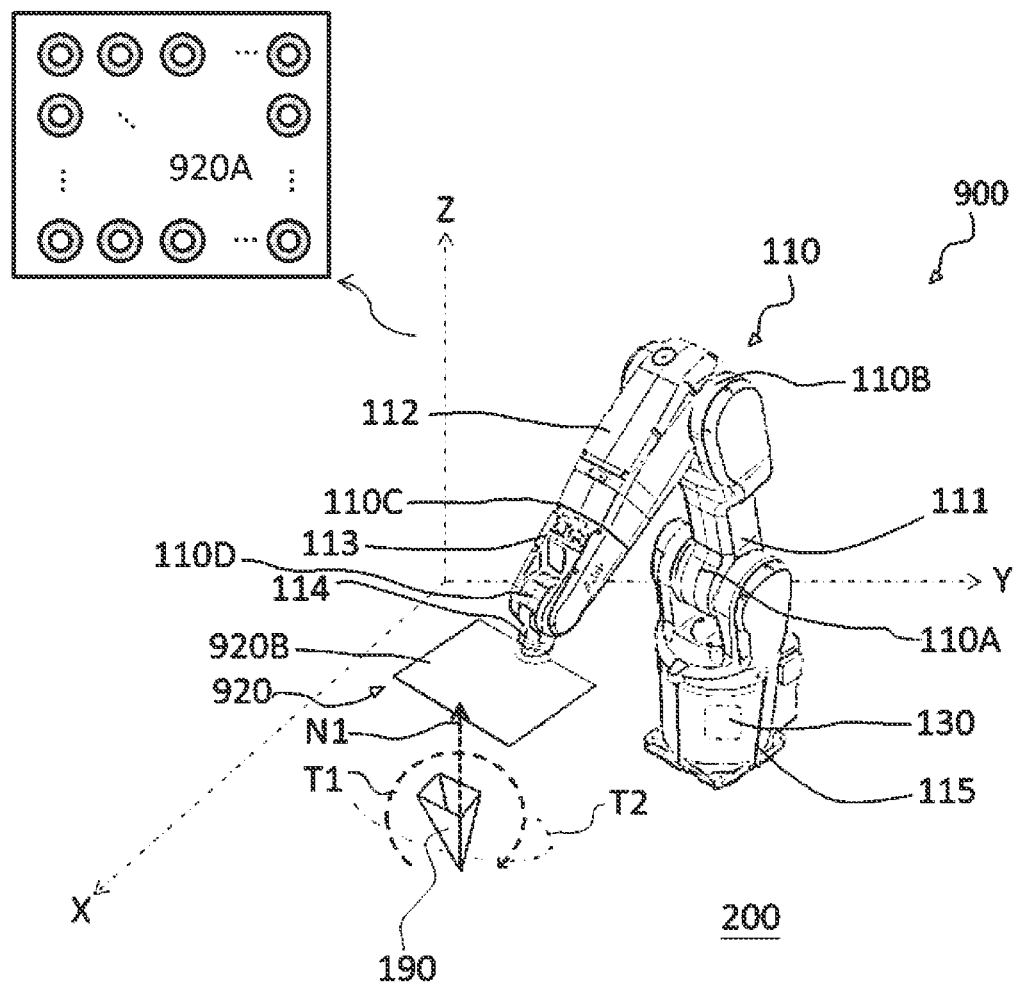
FIG. 9 is a view of measuring an AUT with an antenna measurement system according to another embodiment of the present invention.

Next, the embodiment of FIGS. 9-12 replaces the disc-shaped reflection surface of FIGS. 1 to 4 with a reflection matrix. With reference to FIG. 9, FIG. 9 is a view of measuring an AUT 190 with an antenna measurement system 900 according to an embodiment of the present invention. The antenna measurement system 900 differs from the antenna measurement system 100 in that the antenna measurement system 900 replaces the disc-shaped reflection surface with a reflection matrix. The measurement component 920 includes a reflection matrix 924, a feed antenna 925 (shown in FIG. 6), and a connecting portion 926. The connecting portion 926 is configured to connect the reflection matrix 924 with the feed antenna 925, and to allow the feed antenna to be separated from the reflection matrix by a predetermined distance as the focal length. How to set the predetermined distance is not the main discussion part of the present invention, so it will not be described in detail. In the present embodiment, the signal of the feed antenna 925 is also a spherical wave or a cylindrical wave, which, after being reflected by each unit in the reflection matrix 924, is converted into a plane wave and sent to the AUT 190.

A reflection surface 920A of the reflection matrix 920 is shown in the upper left corner of FIG. 9, including M×N reflection units for reflecting the signal from the feed antenna 925 as the incident signal of the AUT 190, wherein the feed antenna 925 is located between the reflection matrix 924 and the AUT 190 when the processor 130 controls the measurement component 920 to move along the scanning path relative to the AUT 190, M and N being positive integers.

When the antenna measurement system 900 performs a measurement, the AUT 190 will remain stationary, and the processor 130 controls the measurement component 920 to scan the AUT 190 along an arc of the AUT 190 at a specific longitude, wherein the arc scan of each longitude starts at the reference surface 200 (i.e., a bottom of a normal line N1) and ends after circling the AUT 190 (e.g., as shown by the track T1, but according to the actual shape of the measurement component 920, the circling angle should be slightly less than 360 degrees); however, after the arc scan in this longitude is completed, the reflection surface 920A of the reflection matrix 924 keeps facing the AUT 190, moves along the track T2 to the next longitude to continue the arc scan, and finally completes an entire spherical scan. In other words, the overall scanning path used for measurement takes the AUT 190 as the center of the sphere, and moves−180 degrees to +180 degrees along the longitude line of the virtual sphere, as well as performing a circular scan starting in the X-Y plane and ending in the X-Y plane at different longitudes, wherein two consecutive scans in different longitudes may differ by 1 degree in longitude, which is not limited by the present invention. Moreover, the scanning path of the measurement component 920 may be input to the processor 130 by the user in advance, wherein the user may define the sampling interval or the articulated robot to measure the moving speed.

Figure 10:
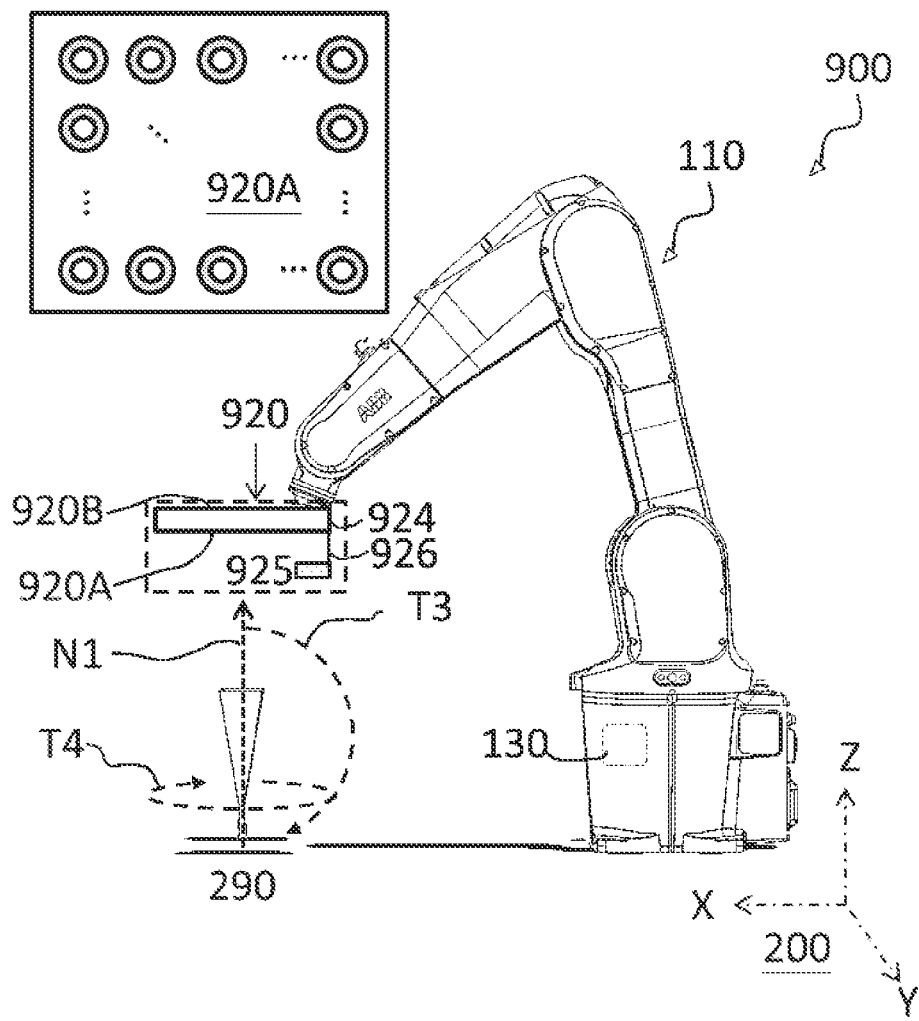
FIG. 10 is a view of measuring an AUT with an antenna measurement system according to another embodiment of the present invention.

With reference to FIG. 10, FIG. 10 is a view of measuring an AUT 290 with an antenna measurement system 900 according to another embodiment of the present invention. In the present embodiment, when the antenna measurement system 900 performs measurement, the AUT 290 rotates with the normal line N1 of the reference surface 200 as the axis (as shown by a track T4); in this way, the processor 130 does not need to perform arc scan in multiple longitudes. As shown in FIG. 10, the processor 130 controls the reflection surface 920A to perform arc scan toward the AUT 290 without displacement in the longitude direction (as shown by a track T3), wherein the arc scan starts at the normal line N1 and ends after circling the AUT 290 for 180 degrees. For example, after the measurement component 920 performs a certain longitudinal scan of the AUT 290 along the track T3, the AUT 290 will rotate horizontally in the direction (parallel to the reference surface 200), so that it perform scan in the next longitude toward the reflection surface 920A, and then the measurement component 920 repeats the scan of the track T3, and so on, until an entire spherical scan is completed, wherein two consecutive scans in different longitudes may differ by 1 degree in longitude, which is not limited by the present invention.

Compared with the embodiment of FIG. 9, a motion path of the articulated robot 110 in FIG. 10 is relatively simple, but the AUT 290 needs to be built-in or mounted on a rotating device, such as a turntable (not shown). For example, the rotating device may be coupled to the processor 130 for receiving a control signal from the processor 130, so that the rotating device drives the AUT 290 to rotate around the normal line N1 as the axis. Through the rotation of the AUT 290, the articulated robot 110 only needs to circle the virtual sphere along the AUT 290 for half a circle, e.g., moving 180 degrees downwards from the circular longitude line 0 degrees around the AUT 290 with a center point of the AUT 290 as a center of circle (e.g., as shown by the track T3, but according to the actual shape of the measurement component 920, the circling angle should be slightly less than 180 degrees) while the AUT 290 maintaining a−180 to 180 rotation in the horizontal direction (e.g., as shown by the track T4, parallel to the reference surface 200).

Figure 11:
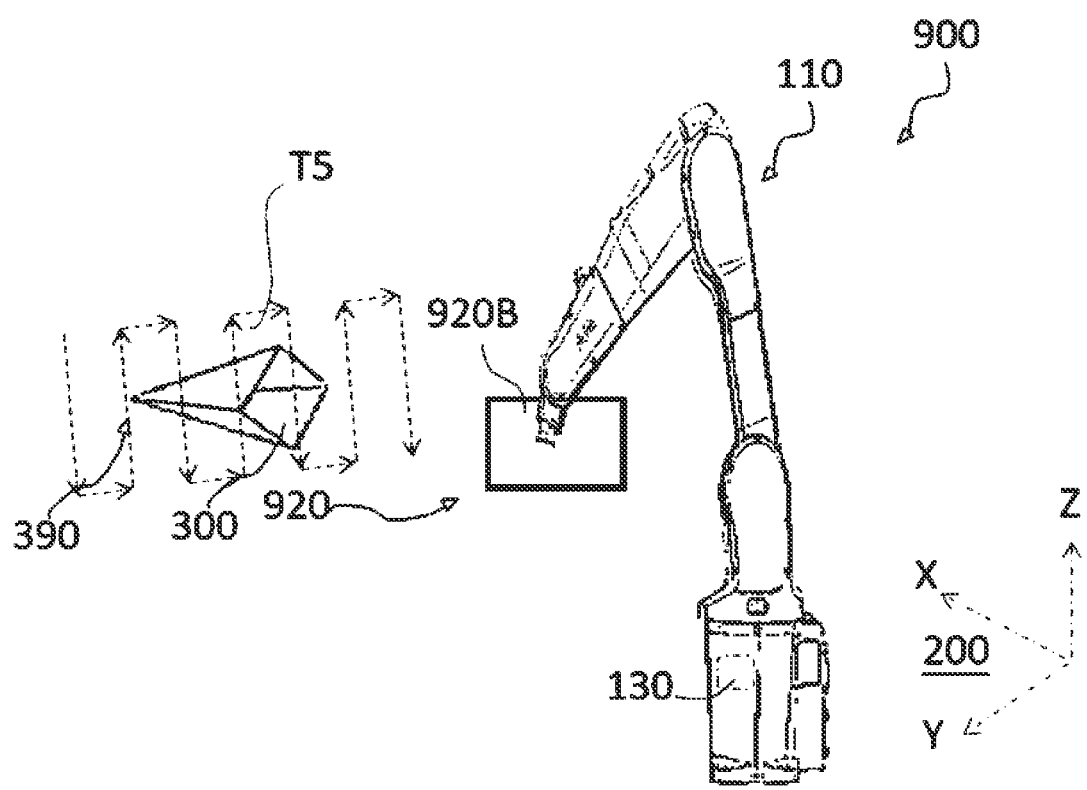
FIG. 11 is a view of measuring an AUT with an antenna measurement system according to another embodiment of the present invention.

With reference to FIG. 11, FIG. 11 is a view of measuring an AUT 390 with an antenna measurement system 900 according to another embodiment of the present invention. In the present embodiment, when the antenna measurement system 900 performs measurement, the AUT 390 is substantially parallel to the reference surface 200, and a radiation surface 300 of the AUT 390 (may be a virtual plane, i.e., the Y-Z plane) is substantially facing the reflection surface 920A (only the back surface 920B of the measurement component 920 appears in the viewing angle of FIG. 11). During the measurement, the AUT 390 remains stationary, the processor 130 controls the measurement component 920 and the radiation surface 300 to maintain a predetermined distance to perform a two-dimensional planar scan with vertical movement and horizontal movement alternately (e.g., as shown by a track T5), wherein the two-dimensional planar scan may be cyclic operation sequences of high-to-low movement, side-to-side movement, low-to-high movement, and side-to-side movement. For example, when the articulated robot is facing the AUT 390 in the X-axis direction, the scanning path will move in an S-like manner on the Y-Z plane until the entire planar scan of the AUT 390 is completed.

Figure 12:
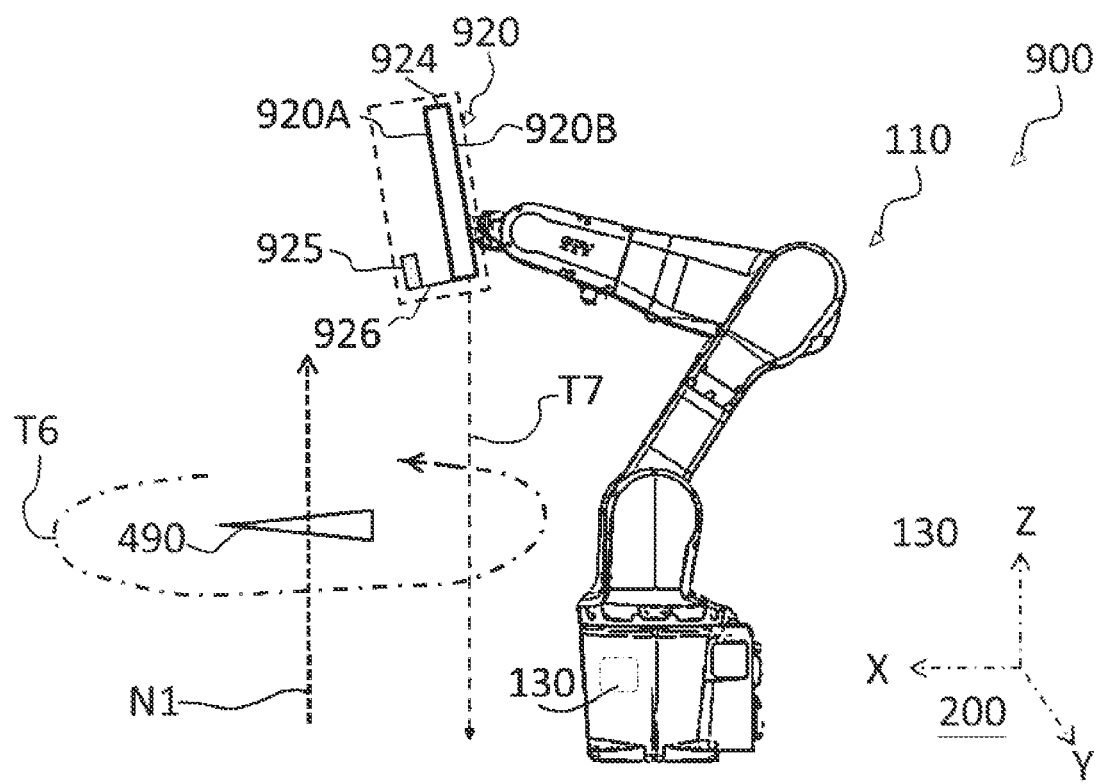
FIG. 12 is a view of measuring an AUT with an antenna measurement system according to another embodiment of the present invention.

With reference to FIG. 12, FIG. 12 is a view of measuring an AUT 490 with an antenna measurement system 900 according to another embodiment of the present invention. In the present embodiment, when the antenna measurement system 900 performs measurement, the AUT 490 is substantially parallel to the reference surface 200. During the measurement, the AUT 490 rotates with the normal line N1 as the axis (as shown by a track T6), the processor 130 controls the measurement component 920 to perform a linear scan in the direction of gravity (i.e., the Z-axis direction) for the AUT (as shown by a track T7), the scanning path keeps moving up and down vertically, and the AUT 490 rotates from −180 degrees to +180 horizontally (parallel to the reference surface 200). In detail, the measurement method is that the articulated robot 110 moves vertically from the highest point to the lowest point, or from the lowest point to the highest point; during the movement, the track T7 will remain parallel to the normal line N1. After the articulated robot 110 completes the vertical scan of the current longitude position, the AUT 490 rotates to the next longitude position, and the articulated robot 110 performs vertical scan again, and so on, until an entire cylindrical measurement program is completed, wherein two consecutive scans in different longitudes may differ by 1 degree in longitude, which is not limited by the present invention. Similar to the AUT 290 in FIG. 10, the AUT 490 in FIG. 12 may be built-in or mounted with a rotating device (not shown) to achieve a rotating effect. For example, the rotating device may be coupled to the processor 130 for receiving a control signal from the processor 130, so that the rotating device drives the AUT 490 to rotate around the normal line N1 as the axis. Similarly, the AUTs 190 to 490 of FIGS. 9 to 12 may be additionally coupled to a network analyzer for further analysis of the data.

Figure 13:
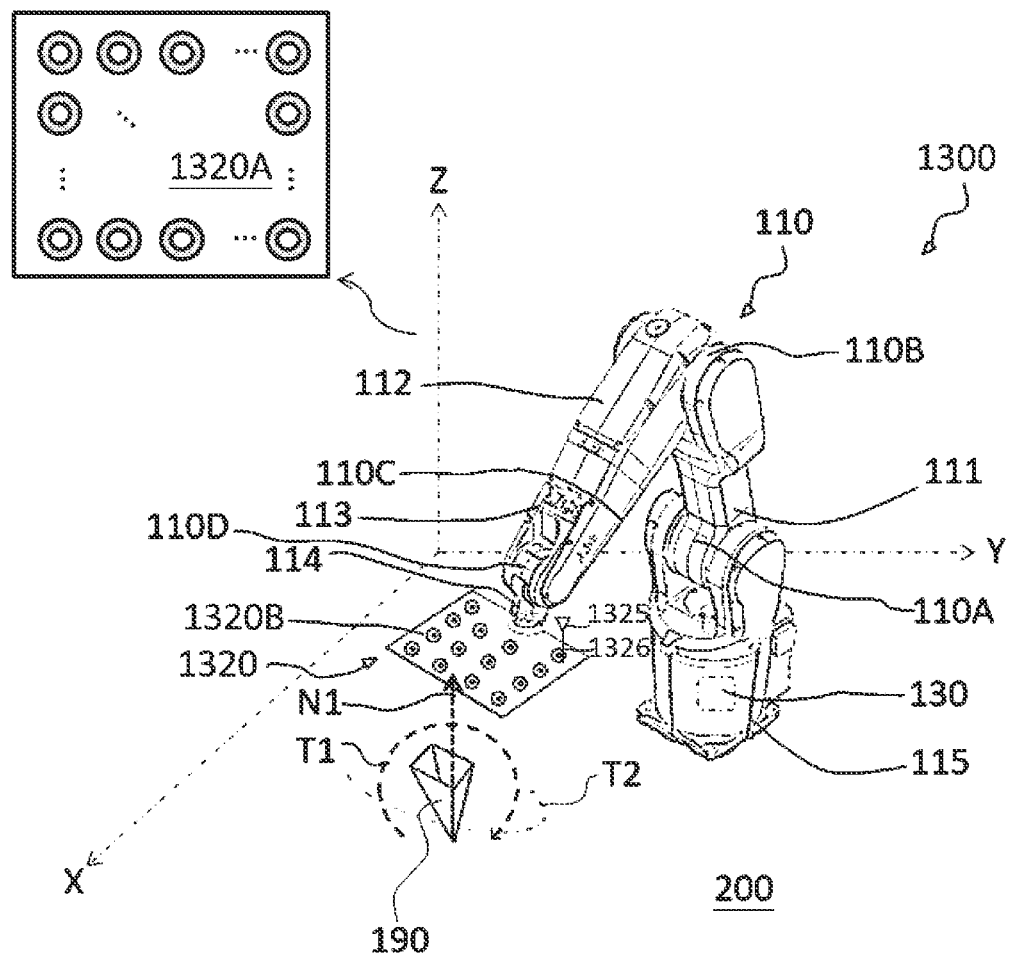
FIG. 13 is a view of measuring an AUT with an antenna measurement system according to another embodiment of the present invention.

Next, the embodiment of FIGS. 13-16 replaces the disc-shaped reflection surface of FIGS. 1 to 4 with a transmission matrix. With reference to FIG. 13, FIG. 13 is a view of measuring an AUT 190 with an antenna measurement system 1300 according to an embodiment of the present invention. The antenna measurement system 1300 differs from the antenna measurement system 100 in that the antenna measurement system 1300 replaces the disc-shaped reflection surface with a transmission matrix. The measurement component 1320 includes a transmission matrix 1324, a feed antenna 1325, and a connecting portion 1326. The connecting portion 1326 is configured to connect the transmission matrix 1324 with the feed antenna 1325, and to allow the feed antenna to be separated from the reflection matrix by a predetermined distance as the focal length. How to set the predetermined distance is not the main discussion part of the present invention, so it will not be described in detail. In the present embodiment, the signal of the feed antenna 1325 is also a spherical wave or a cylindrical wave, which is converted into a plane wave by the transmission matrix 1324 and sent to the AUT 190. In an embodiment not shown, also, the transmission matrix 1324 may not be provided, but a feed antenna 1325 forms an array of antennas for directly sending signals to form the overall signal into the plane wave for sending to the AUT 190.

A transmission surface 1320A of the transmission matrix 1320 is shown in the upper left corner of FIG. 13, including M×N transmission units to transmit the signal from the AUT 190; the above-mentioned transmission unit may further be seen on a back surface 1320B. In addition, the feed antenna 1325 is configured to provide the incident signal to the AUT 190. When the processor 130 controls the measurement component 1320 to move relative to the AUT 190 along the scanning path, the transmission matrix 1324 (not shown in FIG. 13, with reference to FIG. 14) is located between the AUT 190 and the feed antenna 1325, and M and N are positive integers.

When the antenna measurement system 1300 performs a measurement, the AUT 190 will remain stationary, and the processor 130 controls the measurement component 1320 to scan the AUT 190 along an arc of the AUT 190 at a specific longitude, wherein the arc scan of each longitude starts at the reference surface 200 (i.e., a bottom of a normal line N1) and ends after circling the AUT 190 (e.g., as shown by the track T1, but according to the actual shape of the measurement component 1320, the circling angle should be slightly less than 360 degrees); however, after the arc scan in this longitude is completed, the transmission surface 1320A of the transmission matrix 1324 keeps facing the AUT 190, moves along the track T2 to the next longitude to continue the arc scan, and finally completes an entire spherical scan. In other words, the overall scanning path used for measurement takes the AUT 190 as the center of the sphere, and moves −180 degrees to +180 degrees along the longitude line of the virtual sphere, as well as performing a circular scan starting in the X-Y plane and ending in the X-Y plane at different longitudes, wherein two consecutive scans in different longitudes may differ by 1 degree in longitude, which is not limited by the present invention. Moreover, the scanning path of the measurement component 1320 may be input to the processor 130 by the user in advance, wherein the user may define the sampling interval or the articulated robot to measure the moving speed.

Figure 14:
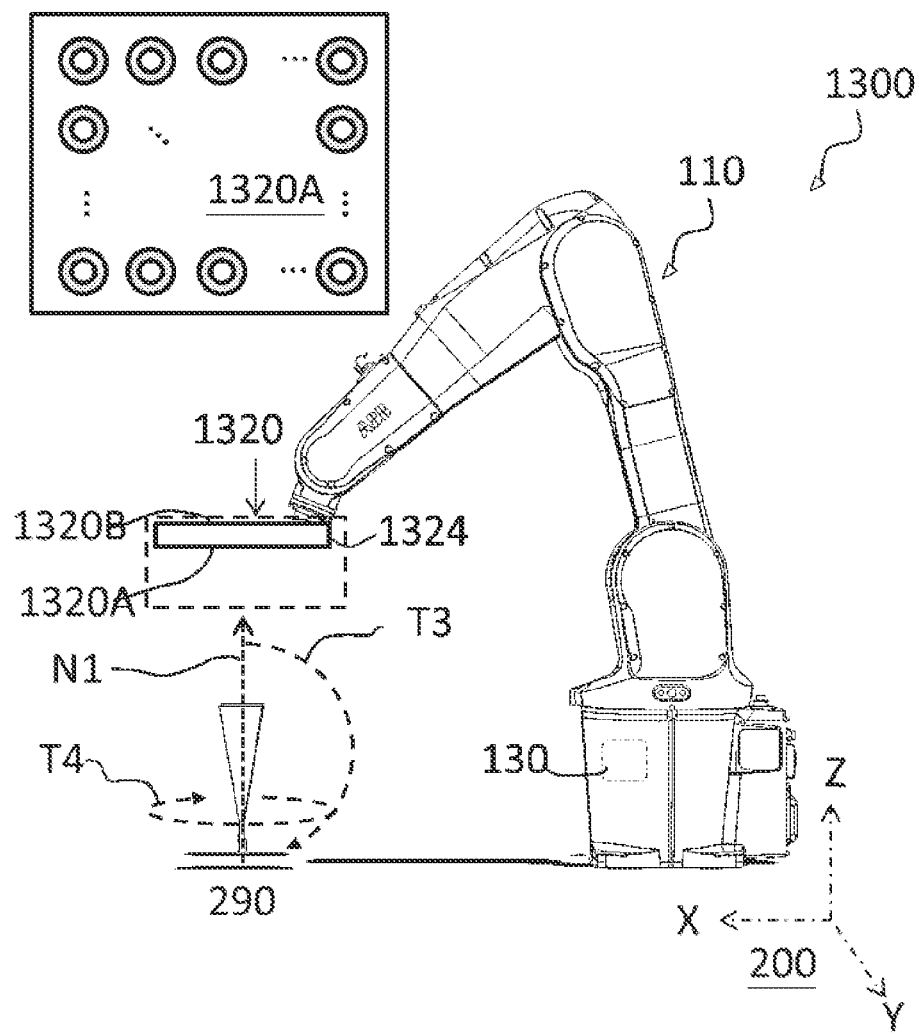
FIG. 14 is a view of measuring an AUT with an antenna measurement system according to another embodiment of the present invention.

With reference to FIG. 14, FIG. 14 is a view of measuring an AUT 290 with an antenna measurement system 1300 according to another embodiment of the present invention. In the present embodiment, when the antenna measurement system 1300 performs measurement, the AUT 290 rotates with the normal line N1 of the reference surface 200 as the axis (as shown by a track T4); in this way, the processor 130 does not need to perform arc scan in multiple longitudes. As shown in FIG. 14, the processor 130 controls the transmission surface 1320A to perform arc scan toward the AUT 290 without displacement in the longitude direction (as shown by a track T3), wherein the arc scan starts at the normal line N1 and ends after circling the AUT 290 for 180 degrees. For example, after the measurement component 1320 performs a certain longitudinal scan of the AUT 290 along the track T3, the AUT 290 will rotate horizontally in the direction (parallel to the reference surface 200), so that it perform scan in the next longitude toward the transmission surface 1320A, and then the measurement component 1320 repeats the scan of the track T3, and so on, until an entire spherical scan is completed, wherein two consecutive scans in different longitudes may differ by 1 degree in longitude, which is not limited by the present invention.

Compared with the embodiment of FIG. 13, a motion path of the articulated robot 110 in FIG. 10 is relatively simple, but the AUT 290 needs to be built-in or mounted on a rotating device, such as a turntable (not shown). For example, the rotating device may be coupled to the processor 130 for receiving a control signal from the processor 130, so that the rotating device drives the AUT 290 to rotate around the normal line N1 as the axis. Through the rotation of the AUT 290, the articulated robot 110 only needs to circle the virtual sphere along the AUT 290 for half a circle, e.g., moving 180 degrees downwards from the circular longitude line 0 degrees around the AUT 290 with a center point of the AUT 290 as a center of circle (e.g., as shown by the track T3, but according to the actual shape of the measurement component 1320, the circling angle should be slightly less than 180 degrees) while the AUT 290 maintaining a−180 to 180 rotation in the horizontal direction (e.g., as shown by the track T4, parallel to the reference surface 200). It should be noted that for the sake of brevity, the feed antenna 1325 is omitted in this figure.

Figure 15:
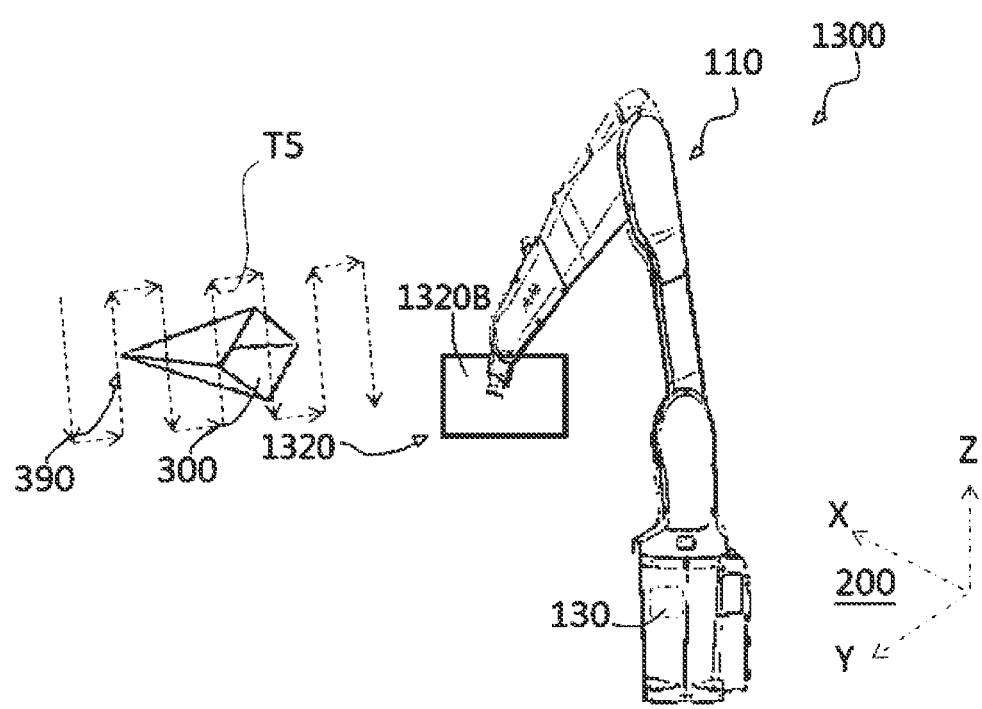
FIG. 15 is a view of measuring an AUT with an antenna measurement system according to another embodiment of the present invention.

With reference to FIG. 15, FIG. 15 is a view of measuring an AUT 390 with an antenna measurement system 1300 according to another embodiment of the present invention. In the present embodiment, when the antenna measurement system 1300 performs measurement, the AUT 390 is substantially parallel to the reference surface 200, and a radiation surface 300 of the AUT 390 (may be a virtual plane, i.e., the Y-Z plane) is substantially facing the transmission surface 1320A (only the back surface 1320B of the measurement component 1320 appears in the viewing angle of FIG. 11). During the measurement, the AUT 390 remains stationary, the processor 130 controls the measurement component 1320 and the radiation surface 300 to maintain a predetermined distance to perform a two-dimensional planar scan with vertical movement and horizontal movement alternately (e.g., as shown by a track T5), wherein the two-dimensional planar scan may be cyclic operation sequences of high-to-low movement, side-to-side movement, low-to-high movement, and side-to-side movement. For example, when the articulated robot is facing the AUT 390 in the X-axis direction, the scanning path will move in an S-like manner on the Y-Z plane until the entire planar scan of the AUT 390 is completed. It should be noted that for the sake of brevity, the feed antenna 1325 is omitted in this figure.

Figure 16:
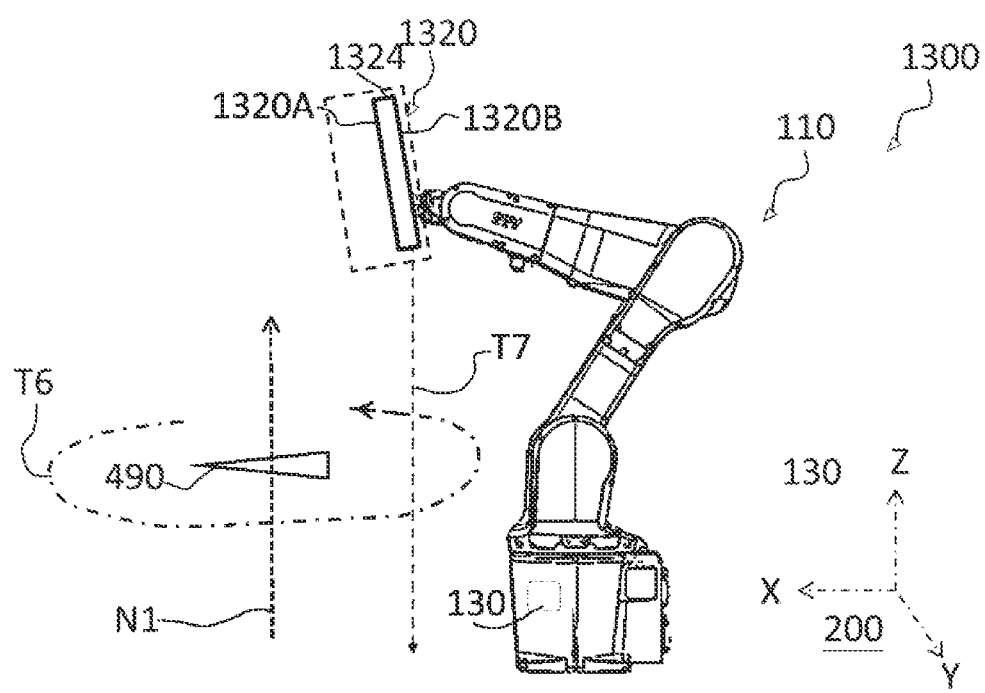
FIG. 16 is a view of measuring an AUT with an antenna measurement system according to another embodiment of the present invention.

With reference to FIG. 16, FIG. 16 is a view of measuring an AUT 490 with an antenna measurement system 1300 according to another embodiment of the present invention. In the present embodiment, when the antenna measurement system 1300 performs measurement, the AUT 490 is substantially parallel to the reference surface 200. During the measurement, the AUT 490 rotates with the normal line N1 as the axis (as shown by a track T6), the processor 130 controls the measurement component 1320 to perform a linear scan in the direction of gravity (i.e., the Z-axis direction) for the AUT (as shown by a track T7), the scanning path keeps moving up and down vertically, and the AUT 490 rotates from −180 degrees to +180 horizontally (parallel to the reference surface 200). In detail, the measurement method is that the articulated robot 110 moves vertically from the highest point to the lowest point, or from the lowest point to the highest point; during the movement, the track T7 will remain parallel to the normal line N1. After the articulated robot 110 completes the vertical scan of the current longitude position, the AUT rotates to the next longitude position, and the articulated robot 110 performs vertical scan again, and so on, until an entire cylindrical measurement program is completed, wherein two consecutive scans in different longitudes may differ by 1 degree in longitude, which is not limited by the present invention. Similar to the AUT 290 in FIG. 14, the AUT 490 in FIG. 16 may be built-in or mounted with a rotating device (not shown) to achieve a rotating effect. For example, the rotating device may be coupled to the processor 130 for receiving a control signal from the processor 130, so that the rotating device drives the AUT 490 to rotate around the normal line N1 as the axis. It should be noted that for the sake of brevity, the feed antenna 1325 is omitted in this figure. Similarly, the AUTs 190 to 490 of FIGS. 13 to 16 may be additionally coupled to a network analyzer for further analysis of the data.

It should be noted that although the present invention uses the above embodiments to illustrate the component composition and measurement method of the antenna measurement system, those skilled in the art can replace or modify the component composition and measurement method as needed, as long as it can generate a plane wave to measure the AUT, and it is not intended to limit the present invention.

In summary, compared to traditional practices, the movable compact-range antenna measurement system adopts a novel specific geometric surface design such as disc-shaped reflection surface, lens, matrix transmission surface and matrix reflection surface, etc., which may realize short-distance measurement and maintain the required measurement accuracy and reliability, so that the antenna measurement cost may be greatly reduced. This is because the specific geometric surface only needs a short distance to achieve the effect of long-distance measurement; therefore, if the manufacturer adopts the present invention, the cost of establishing a large measuring site may be saved during measurement. Further, the present invention is particularly suitable for the measurement of frequency bands of millimeter waves, and meets the requirements of production lines. On the other hand, when the AUT is completely stationary (or only rotating in place), the present invention uses the articulated robot to perform adaptive multi-point measurement to obtain multi-angle data of the AUT; therefore, the above results may be realized by only one measurement on a single site, and there is no need to establish multiple measurement sites. Moreover, the articulated robot may include three antenna measurement architectures: planar, cylindrical, and spherical, which may be adjusted to meet different measurement requirements, so that there is no need to build different system for each measurement architecture, which may better meet the requirements of production line applications.

What is claimed is:

1. An antenna measurement system, configured to measure a radiation field pattern of an antenna under test (AUT) fixed on a reference surface, comprising:
   an articulated robot, seated on a periphery of the reference surface;
   a measurement component, arranged on a movable end of the articulated robot, the measurement component comprising a specific geometric surface and a feed antenna, the specific geometric surface being configured to receive a signal from the feed antenna and reflect or focus an incident signal to the AUT accordingly; and a processor, coupled with the movable end, to: control the movable end such that the movable end drives the measurement component to move relative to the AUT along a scanning path and keep the specific geometric surface facing the AUT during the movement along the scanning path.

2. The antenna measurement system according to claim 1, wherein the specific geometric surface is a dish-shaped reflection surface for reflecting the signal from the feed antenna as the incident signal, and wherein the feed antenna is located between the dish-shaped reflection surface and the AUT when the processor controls the measurement component to move along the scanning path relative to the AUT.

3. The antenna measurement system according to claim 1, wherein the specific geometric surface is a lens element for focusing the signal from the feed antenna as the incident signal, and wherein the lens element is located between the AUT and the feed antenna when the processor controls the measurement component to move along the scanning path relative to the AUT.

4. The antenna measurement system according to claim 1, wherein the specific geometric surface is a reflection matrix with M×N reflection elements that comprise hardware for reflecting the signal from the feed antenna as the incident signal, and wherein the feed antenna is located between the reflection matrix and the AUT when the processor controls the measurement component to move along the scanning path relative to the AUT, wherein M and N are positive integers.

5. The antenna measurement system according to claim 1, wherein the specific geometric surface is a transmission matrix with M×N transmission elements that comprise hardware for focusing the signal from the feed antenna as the incident signal, and wherein the transmission matrix is located between the AUT and the feed antenna when the processor controls the measurement component to move along the scanning path relative to the AUT, wherein M and N are positive integers.

6. The antenna measurement system according to claim 1, wherein the AUT remains stationary, and the processor controls the specific geometric surface to perform a plurality of arc-shaped scans corresponding to different longitudes toward the AUT, and wherein any one of the plurality of arc-shaped scans starts from a bottom end of a normal line perpendicular to the reference surface and ends after circling the AUT to the reference surface for a circle to the bottom end of the normal line.

7. The antenna measurement system according to claim 1, wherein during the measurement, the AUT rotates with a normal line of the reference surface as an axis, and the processor controls the specific geometric surface to perform an arc scan at a specific longitude position toward the AUT, and wherein the arc scan starts at a top end of the normal line and ends after circling the AUT to the bottom end of the normal line.

8. The antenna measurement system according to claim 1, wherein during the measurement, the AUT remains stationary, and a radiation surface of the AUT faces the specific geometric surface; the processor controls the specific geometric surface and the radiation surface to maintain a predetermined distance to perform a two-dimensional planar scan with vertical movement and horizontal movement alternately.

9. The antenna measurement system according to claim 8, wherein the two-dimensional planar scan comprises cyclic operation sequences of high-to-low movement, side-to-side movement, low-to-high movement, and side-to-side movement.

10. The antenna measurement system according to claim 1, wherein the articulated robot further comprises:
a base, seated on the periphery of the reference surface;
a first robotic arm, pivotally connected to the base;
a second robotic arm, pivotally connected to the first robotic arm; and
a third robotic arm, pivotally connected to the second robotic arm and the movable end, wherein the third robotic arm rotates with a length direction of the second robotic arm as an axis;
wherein the movable end is connected to a back surface of the measurement component.

11. The antenna measurement system according to claim 1, wherein the scanning path is a movement track of the specific geometric surface relative to the AUT, wherein a predetermined distance is maintained between the specific geometric surface and the AUT when the specific geometric surface moves along the movement track.

12. The antenna measurement system according to claim 1, wherein the AUT is parallel to the reference surface, during the measurement, the AUT rotates with a normal line of the reference surface as the axis, and the processor controls the specific geometric surface to perform a linear scan along a gravity direction toward the AUT.

13. The antenna measurement system according to claim 1, wherein the processor is built in the articulated robot or externally connected to the articulated robot.

14. The antenna measurement system according to claim 1, wherein the scanning path is input to the processor in advance, or is generated by the articulated robot through performing real-time calculations.

* * * * *